(12) United States Patent
Komninos

(10) Patent No.: US 9,786,033 B2
(45) Date of Patent: Oct. 10, 2017

(54) MEASUREMENT INSTRUMENTATION WITH A ROLLING DISPLAY

(71) Applicant: Radiaulics, Inc., Lone Tree, CO (US)

(72) Inventor: Nikolaos I. Komninos, Lone Tree, CO (US)

(73) Assignee: Radiaulics, Inc., Littleton, CO (US)

(*) Notice: Subject to any disclaimer, the term of this patent is extended or adjusted under 35 U.S.C. 154(b) by 68 days.

(21) Appl. No.: 14/991,480

(22) Filed: Jan. 8, 2016

(65) Prior Publication Data

US 2016/0203622 A1     Jul. 14, 2016

(51) Int. Cl.
| | |
|---|---|
| *G06T 11/20* | (2006.01) |
| *G06T 3/40* | (2006.01) |
| *G01D 7/00* | (2006.01) |
| *G01R 13/00* | (2006.01) |

(52) U.S. Cl.
CPC .......... *G06T 3/40* (2013.01); *G01D 7/00* (2013.01); *G01R 13/00* (2013.01)

(58) Field of Classification Search
None
See application file for complete search history.

(56) References Cited

U.S. PATENT DOCUMENTS

| | | | |
|---|---|---|---|
| 5,369,416 A * | 11/1994 | Haverty | ........ G09G 3/00 345/35 |
| 5,432,755 A | 7/1995 | Komninos | |
| 6,058,076 A | 5/2000 | Komninos | |
| 6,163,504 A | 12/2000 | Komninos | |
| 6,923,063 B2 | 8/2005 | Komninos | |
| 7,051,577 B2 | 5/2006 | Komninos | |
| 7,540,183 B2 | 6/2009 | Komninos | |
| 8,245,576 B2 | 8/2012 | Komninos | |
| 8,468,874 B2 | 6/2013 | Komninos | |
| 8,872,652 B2 | 10/2014 | Komninos | |
| 2010/0313162 A1 * | 12/2010 | Preysman | ........ G01D 7/00 715/781 |
| 2015/0198500 A1 | 7/2015 | Komninos | |

* cited by examiner

*Primary Examiner* — Edward Martello
(74) *Attorney, Agent, or Firm* — Dorr, Carson & Birney PC

(57) ABSTRACT

A method for displaying sensor readings in a measurement instrument having an array of display elements initially divides the range of interest of the sensor reading into a plurality of consecutive sub-ranges and determines a scaling function for displaying sensor readings for each sub-range. For each sensor reading, the appropriate sub-range is determined into which the sensor reading falls (where N is the number of this sub-range). The scaling function for the Nth sub-range is applied to display the sensor reading using N consecutive display elements. Optionally, the system may include a visual or audible indicator for the use when the display rolls from one sub-range to another. The display may also include feature indicating the peak sensor reading encountered.

15 Claims, 13 Drawing Sheets

MEASUREMENT INSTRUMENTATION WITH A ROLLING DISPLAY

RELATED APPLICATION

The present application is based on and claims priority to the Applicant's U.S. Provisional Patent Application 62/101,892, entitled "Measurement Instrumentation with a Rolling Display," filed on Jan. 9, 2015.

BACKGROUND OF THE INVENTION

Field of the Invention

The present invention relates generally to the field of displays for measurement instrumentation. More specifically, the present invention discloses a measurement instrument having a rolling display in which the large dynamic range of sensor readings is displayed using a relatively small array of display elements.

Statement of the Problem

A wide variety of measurement instrumentation have been known for measuring and detecting a physical phenomenon, and providing a visible display for the user in response. For the purposes of this disclosure, the term "measurement instrumentation" should be broadly construed to include any type of instrumentation, detector, sensor, or other device for measuring a physical phenomenon over a very large dynamic range. Ultrasonic leak detectors (ULDs) are one example of such measurement instrumentation. They are often required to span a dynamic range of signal intensity of 120 dB or more.

In addition, measurement instruments are commonly designed to be portable or handheld for convenient use in the field. This creates practical limits on the size and resolution of the display that could be carried by the device. Thus, a large dynamic range is difficult to display in a limited-size display, such as a bar graph.

3. Solution to the Problem

To address these shortcomings in the prior art, the present invention provides a measurement instrument (e.g., an ultrasonic leak detector) having a rolling display that enables a large dynamic range of sensor readings to be displayed using a relatively small array of display elements. In particular, the present invention divides the dynamic range of the device into a plurality of sub-ranges (i.e., N sub-ranges). Sensor readings in the first sub-range are displayed using one display element at a time in the array. Sensor readings in the second sub-range are displayed using two display elements at a time in the array, and sensor readings in the Nth sub-range are displayed using N display elements at a time in the array.

SUMMARY OF THE INVENTION

This invention provides a measurement instrument (e.g., an ultrasonic leak detector) having a rolling display capable of displaying a wide range of sensor readings. The dynamic range of interest is divided into a plurality of sub-ranges or levels. Sensor readings in the first level are displayed using one display element at a time in the array. Sensor readings in the second level are displayed using two display elements at a time in the array, and sensor readings in the Nth level are displayed using N display elements at a time in the array.

The present device may include a visual or audible indicator for the user when the display rolls over from one sub-range to another. The display may also include a feature indicating the peak reading encountered.

These and other advantages, features, and objects of the present invention will be more readily understood in view of the following detailed description and the drawings.

BRIEF DESCRIPTION OF THE DRAWINGS

The present invention can be more readily understood in conjunction with the accompanying drawings, in which.

DETAILED DESCRIPTION OF THE INVENTION

Figure 1:
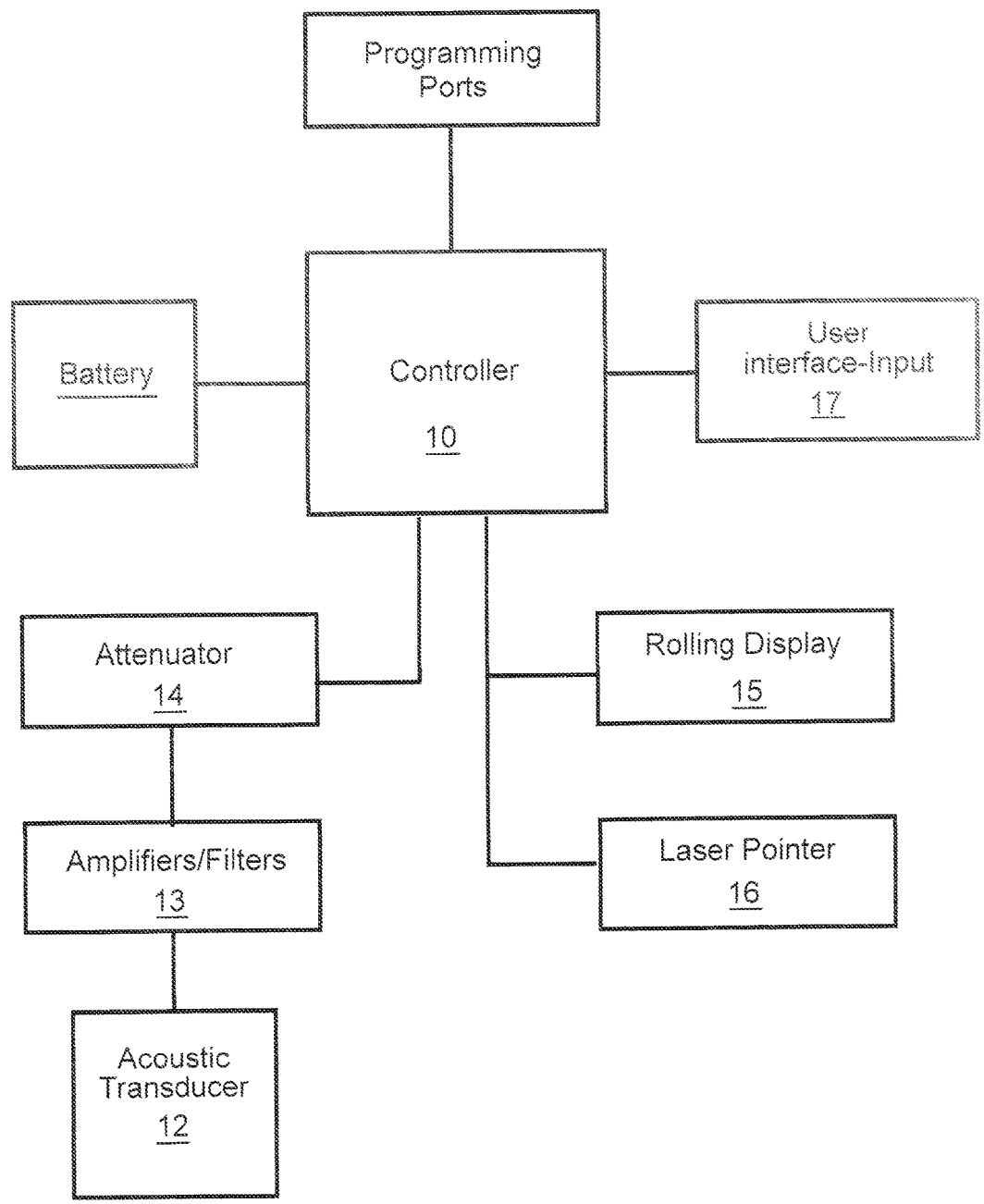
FIG. 1 is a block diagram of an embodiment of the present system.

Turning to FIG. 1, a block diagram is shown of one embodiment of the present invention as an ultrasonic leak detector. The output signal of an appropriate acoustic sensor 12 (for airborne or structure-borne sound) is conditioned by amplifiers/filters 13 to include a frequency band of interest and exclude other bands and noise. An attenuator 14 varies this signal output. The conditioned output signal is processed in a microcontroller 10 (i.e., a computer processor) that digitizes this signal as defined by software. The digitized signal is further processed, analyzed and measured for its energy or intensity. The user can select a desired mode of operation of the device via a user interface 17, such as a set of buttons or switches or a keypad. The intensity of the acoustic signal measured by the microprocessor 10 is displayed for the user via a rolling display 15 under the control of the microprocessor 10, as will be described below.

The present device can be equipped with a speaker or headphones for audio output, or a wireless interface to external devices or the internet. The computer architecture of the present invention permits communication via radio (e.g., Bluetooth, FM, SS or other), infrared, USB or other means with other devices such as headsets, displays, data acquisition, measurement or timing instruments, strobo-scopes, gate generators and the like to enhance the detection capabilities and to provide the operator with a more complete picture of the problem that creates a leak or a mechanical fault. The unit can also be equipped with a laser pointer 16 to illuminate the area of maximum sensitivity of the acoustic sensor 12. The entire system can be packaged as a small handheld unit powered by a battery.

The rolling display 15 is an array of display elements, such as a one-dimensional array of LCD, LED, OLED or plasma display elements, incandescent lights, or pixels or fields on a display screen, or other suitable graphic elements under the control of the micro-controller 10. Typically, this is a relatively small number of display elements, such as ten. In contrast, the dynamic range of interest of the acoustic sensor 12 can be very large, sometimes close to 120 dB (1:1,000,000). This makes it very difficult to detect low intensity signals even if a logarithmic response is used, and very easy to saturate the display if a large leak is detected very close to the transducer.

The rolling display 15 in the present device can display a large dynamic range of an acoustic sensor/transducer 12 using a limited number of display elements. The processor 10 divides the dynamic range into a plurality (N) of sub-ranges or levels. Each level is then scaled so that it can be displayed using the number of display elements in rolling display. The scaling function can be linear, logarithmic, or any other suitable function. Different scaling functions can be employed for different sub-ranges. In addition, a suitable scaling function could be applied to the entire dynamic range of the sensor data prior to dividing it into sub-ranges.

The display elements in the rolling display 15 are used to represent a progressive series of sensor reading values ranging from lowest to highest within each sub-range. In one embodiment, the display elements are arranged as a linear array (e.g., a linear series of display elements ordered from 1 to 10, with each representing $\frac{1}{10}$ of the range for the sub-range using a linear scale). It should be understood that the number of display elements and the scaling function are matters of design choice.

Figure 2:
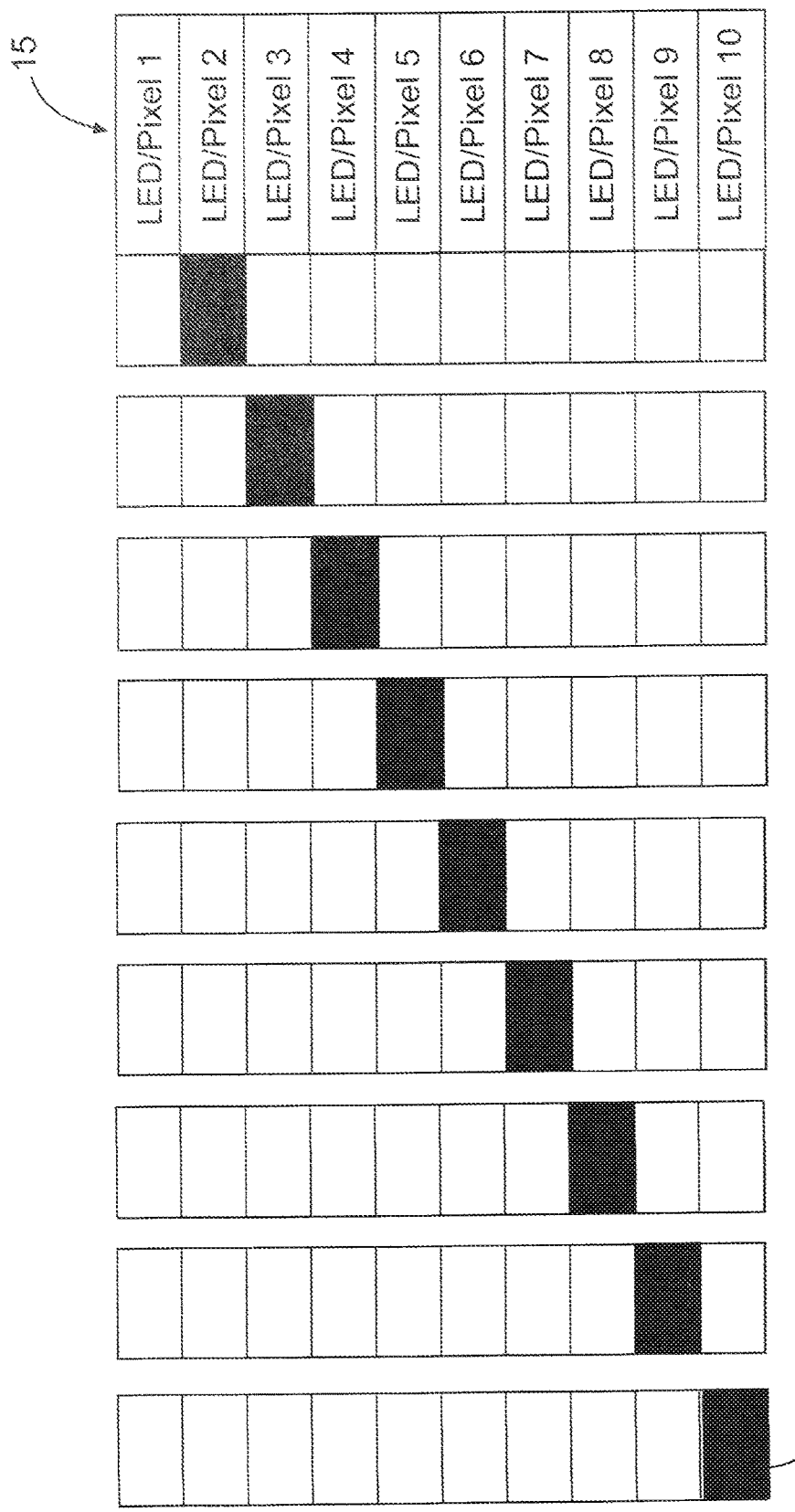
FIG. 2 is a diagram illustrating the rolling display in a first sub-range using one display element 20 at a time.
Figure 3:
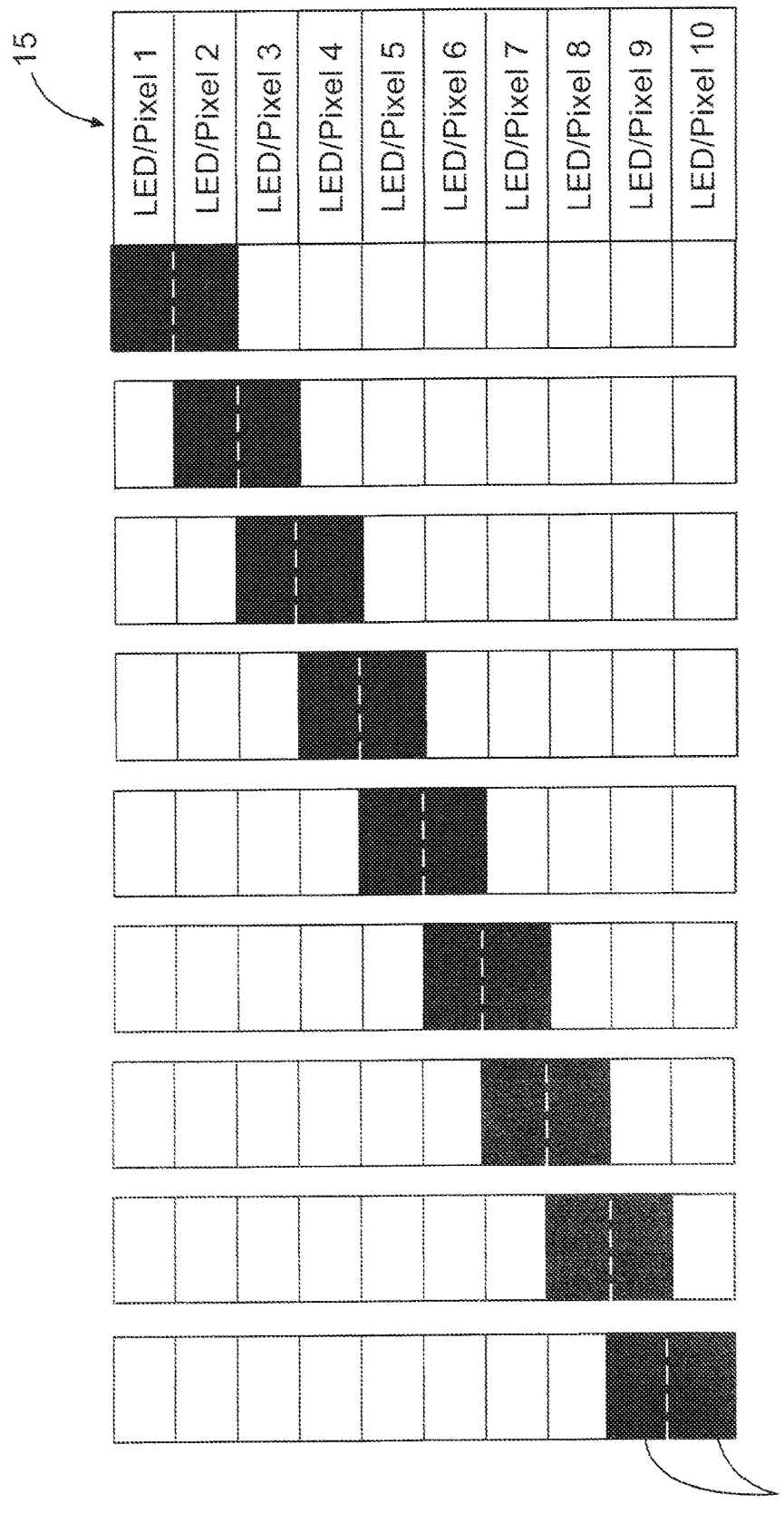
FIG. 3 is a diagram illustrating the rolling display in a second sub-range using two display elements 30 at a time.
Figure 4:
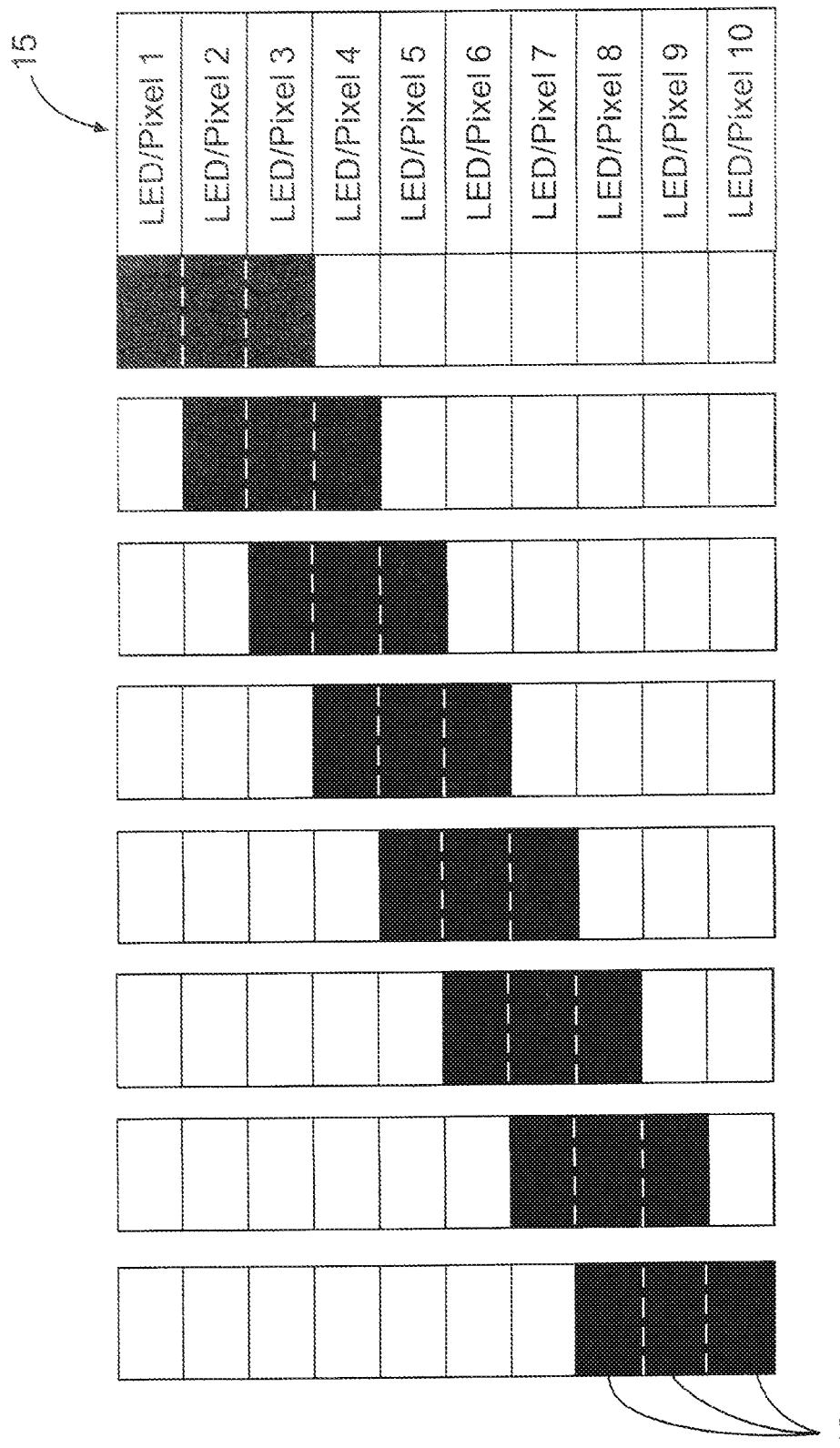
FIG. 4 is a diagram illustrating the rolling display in a third sub-range using three display elements 40 at a time.
Figure 5:
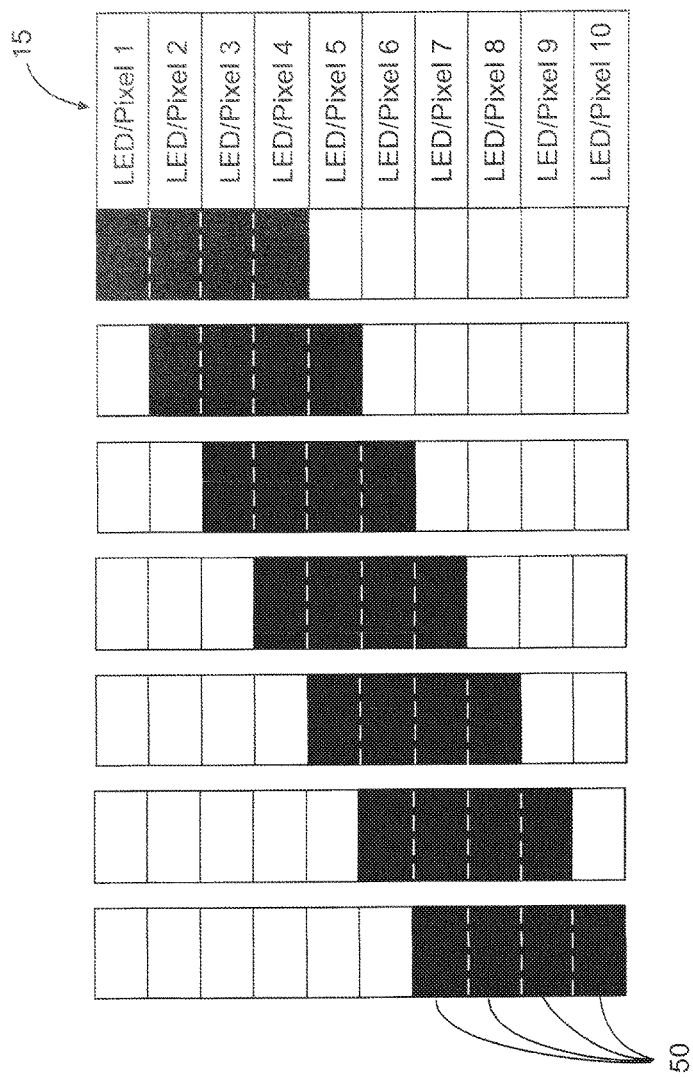
FIG. 5 is a diagram illustrating the rolling display in a fourth sub-range using four display elements 50 at a time.

In the first (lowest) sub-range, the processor 10 controls the rolling display 15 to display sensor readings using only one display element 20 at a time in the array 15, as shown for example in FIG. 2. Sensor readings in the second sub-range are displayed using two display elements 30 at a time in the array 15, as shown in FIG. 3. Sensor readings in the Nth sub-range are displayed using N display elements 40, 50 at a time in the array, as shown in FIGS. 4 and 5 for N=3 and N=4, respectively. Preferably, sets of adjacent display elements are used in the displays for the second through Nth sub-ranges as shown in FIGS. 3-5. The present device may include a visual or audible indicator 65 (FIG. 6) for the user when the display 15 rolls over from one sub-range to another.

When searching for a small leak at the detection limit of the transducer, minute signal changes can make a huge difference in the success of detecting such a leak. A flickering light can be noise or an interfering sound, but it can also be a leak. However, two or three lights that can appear in a given direction and disappear when turning away from it, is more likely to be a leak. With the processing capabilities of the micro-controller 10, the rolling display 15 can be made to have very small steps when the signal is low and change as the signal gets larger to accommodate the dynamic range of the sensor.

For example when the signal level is low (e.g., 10% of the maximum displayed value or MDV), the step could be $\frac{1}{100}$ of the MDV. When the signal rises to 20% of MDV the step can go to $\frac{1}{50}$ of MDV, then as the signal rises even more the step can go to $\frac{1}{25}$ then $\frac{1}{20}$, $\frac{1}{10}$ and so on. The benefit of this technique is the ability to see very small changes when the incoming signal is weak and not saturate the display when the signal becomes large even if it gets to be larger than ten times the value that would saturate the display in the beginning range as in the example above. Currently bar graph displays have to match the size of the step to the number of digits and to the span of the input signal. The rolling display used in the present invention adapts to the signal range like a dynamic zoom.

The present device can also generate an audible or visual indication 65 (in FIG. 6) for rolling over from one level to another. In other words, a notification can be provided when the signal exceeds the MDV or the display is at or past maximum. With this notification, the user is made aware that the instrument is saturated.

As a general overview, the present methodology initially determines the dynamic range of sensor readings of interest, and divides this range into a plurality of consecutive sub-ranges. A scaling function is determined for each sub-range for converting sensor readings within that sub-range into an appropriate set of display elements in the array of the display 15 based on the value of the sensor reading within the sub-range (and using N display elements in the Nth sub-range as previously described). In the subsequent operational mode of the instrumentation, a processor 10 iteratively receives sensor readings from the sensor 12. For each sensor reading, the processor 10 determines which sub-range the sensor reading falls into. The scaling function for that sub-range is then applied by the processor 10 to convert the sensor reading into a set of N display elements based on value of the sensor reading within the Nth sub-range. The processor 10 controls the display 15 to activate these selected display elements. In short, the processor 10 displays the sensor reading on the display 15 with N consecutive display element to indicate the Nth sub-range and the position of the N consecutive display elements within the array indicates the value of the sensor reading within the Nth sub-range based on the scaling function for the Nth sub-range.

For example, the scaling function for each sub-range can be implemented as a predetermined series of limits for activating each set of display elements in the rolling display 15. The process can then be implemented as a series of if-then tests to determine which set of display elements to activate for any sensor reading within the sub-range.

Figure 9:
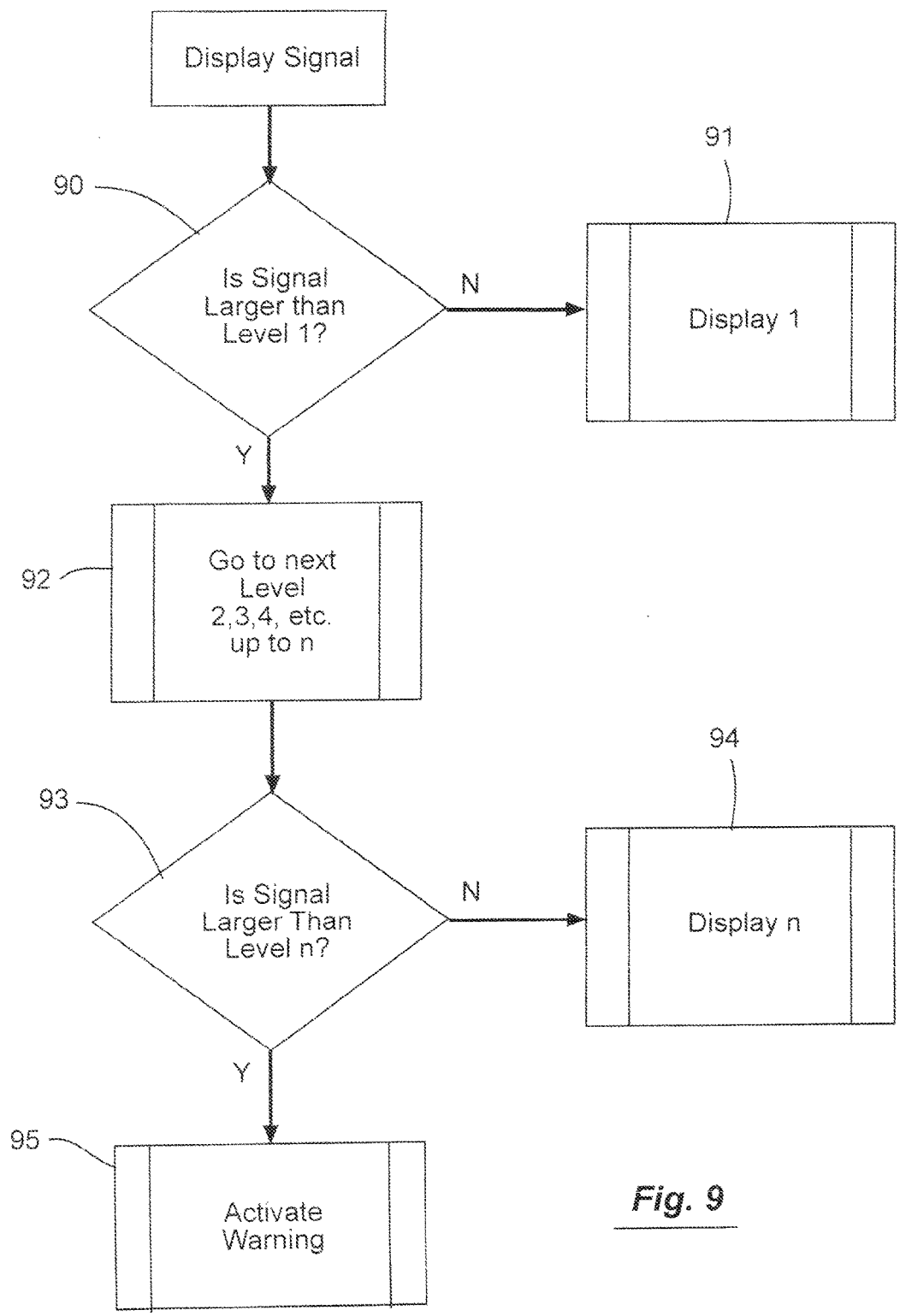
FIG. 9 is a flowchart for the first sub-range in which the rolling display uses one display element at a time.

FIG. 9 is a flowchart of one embodiment of a scaling function for the first sub-range in which the rolling display 15 uses one display element 20 at a time, as shown for example in FIG. 2. In FIG. 9, the sensor reading (or signal) is progressively compared against a series of predetermined levels (i.e., levels 1 through n, where n is the number of display elements 15 in the display array) in steps 90, 92 and 93. For example, if this value does not exceed level 1, the first display element is triggered (step 91). This comparison process can progressively continue through level n for triggering the nth display element. However, if the value exceeds level n in step 93, an indicator is activated to warn the user that the first sub-range has been exceeded, in step 95.

Figure 10:
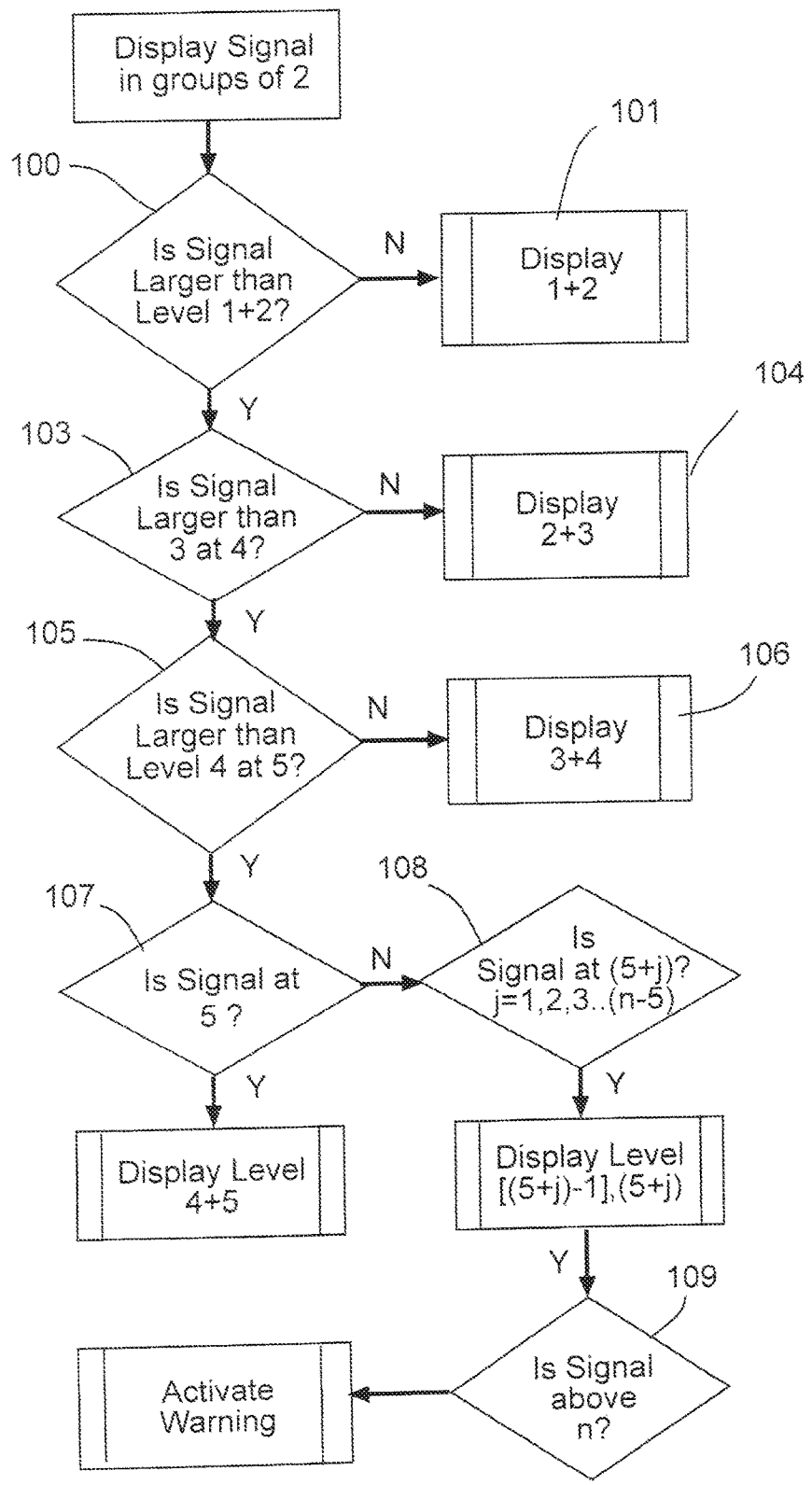
FIG. 10 is a flowchart for the second sub-range in which the rolling display uses two display elements at a time.

The rolling display 15 is controlled such that when the value of the last display element (i.e., the nth display element) is exceeded, the display automatically rolls over to the next higher sub-range of the input signal (i.e., the second sub-range), and two display elements 30 at a time are used, as shown in FIGS. 3 and 10. In this second sub-range, the rolling display 15 functions the first set is display elements 1+2, the second is 2+3, the third is 3+4 and so on until the maximum value (i.e., n−1 and n) for the second sub-range is reached.

FIG. 10 is a flowchart for the second sub-range in which the rolling display uses two display elements 30 at a time, as shown in FIG. 3. As illustrated in FIG. 10, the scaling function for the second sub-range first tests whether the signal is larger than a predetermined level for display elements 1+2 (step 100). If not, display elements 1+2 are activated (step 101). If the signal is larger than the level for display elements 1+2, the scaling function tests whether the signal is larger than the next predetermined level for display elements 2+3 (step 103), If not, display elements 2+3 are active (step 104). Otherwise, the process continues on for the predetermined levels for display elements 3+4 (steps 105 and 106), 4+5 (step 107) and so on until display elements (n−1)+n are reached (step 108). If the signal exceeds the maximum level for the second sub-range (i.e., the level for (n−1)+n) (step 109), an indicator is activated to warn the user.

Figure 11:
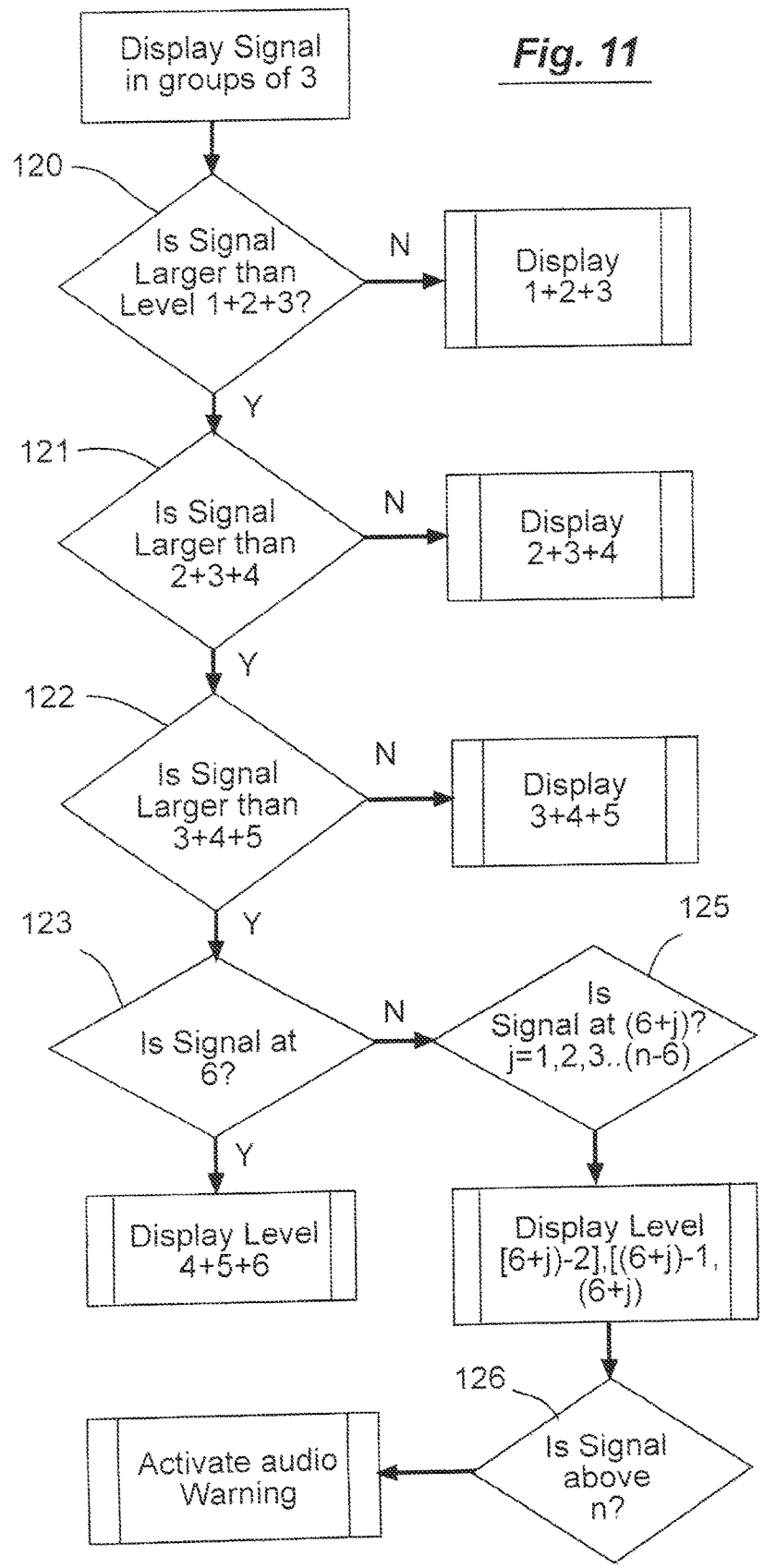
FIG. 11 is a flowchart for the third sub-range in which the rolling display uses three display elements at a time.

When the upper end of the second sub-range is reached, the next higher sub-range (i.e., the third) will be displayed by illuminating a set of three display elements 40 that roll up as 1+2+3 to 2+3+4 to 3+4+5 and so on until the end of the third sub-range is reached, as shown in FIG. 4. FIG. 11 is a flowchart for this third sub-range. Here again, the scaling function initially tests whether the signal is larger than the level for display elements 1+2+3 (step 120). If not, display elements 1+2+3 are activated. Otherwise, the process continues for the levels associated with display elements 2+3+4 (step 121), 3+4+5 (step 122) and so on (steps 123-125) until display elements (n−2)+(n−1)+n are reached. If the signal exceeds the maximum level for the third sub-range (step 126), an indicator is activated to warn the user.

Figure 12:
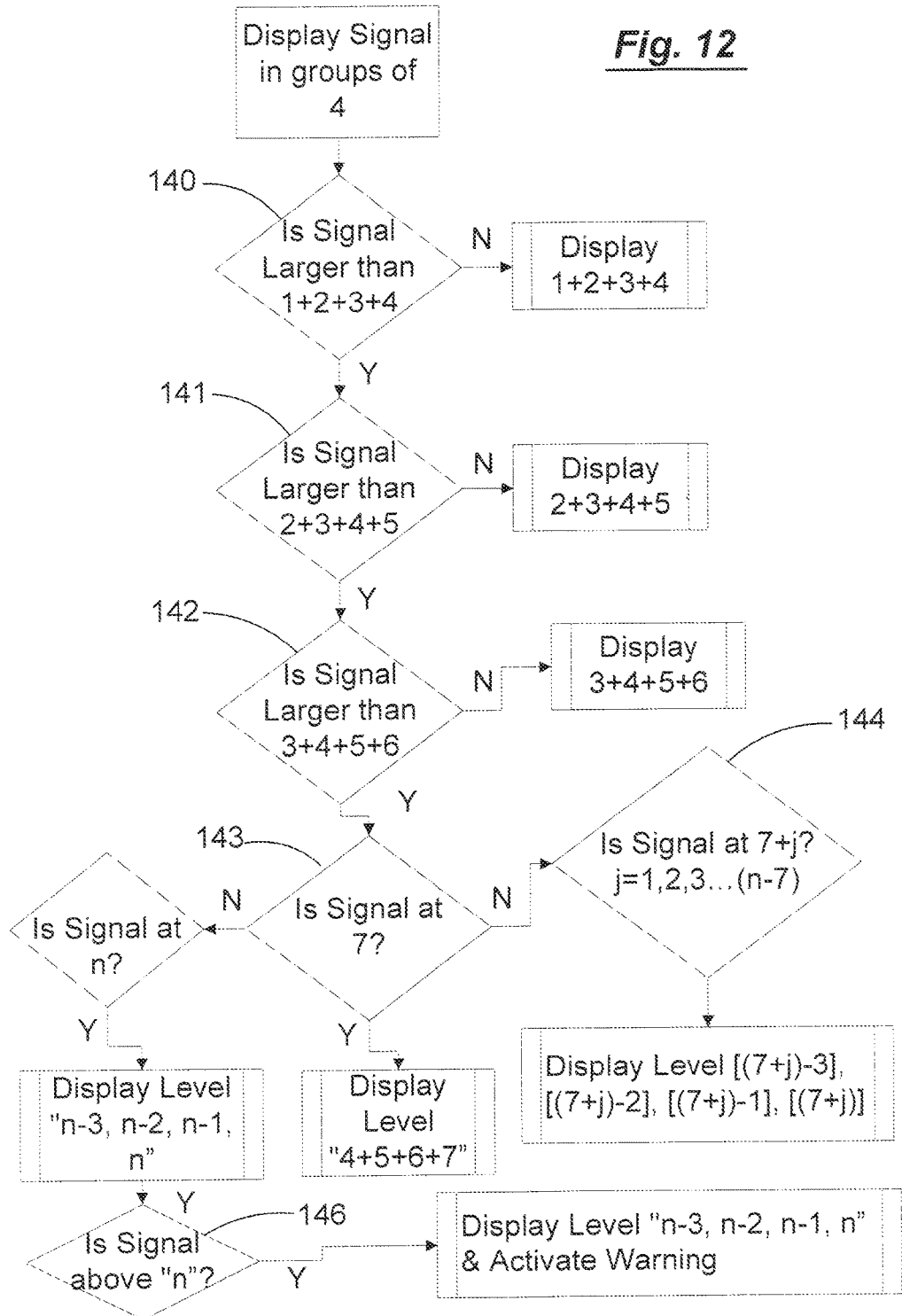
FIG. 12 is a flowchart for the fourth sub-range in which the rolling display uses four display elements at a time.

FIG. 12 is a flowchart for the fourth sub-range in which the rolling display 15 uses four display elements 50 at a time, as shown in FIG. 5. As the signal increases, the display 15 will show 1+2+3+4 to be followed by 2+3+4+5 to be followed with 3+4+5+6 and so on. The scaling function initially tests whether the signal is larger than the level for display elements 1+2+3+4 (step 140). If not, display elements 1+2+3+4 are activated. Otherwise, the process continues for the levels associated with display elements 2+3+4+5 (step 141), 3+4+5+6 (step 142) and so on (steps 143 and 144) until the highest four display elements in the array are reached. If the signal exceeds the maximum level for the fourth sub-range (step 146), an indicator is activated to warn the user.

This process can be generalized for additional sub-ranges (i.e., 5-N). Returning to the fifth sub-range, the display uses five display elements at a time. The first level of this sub-range uses display elements 1+2+3+4+5. The next indicated level moves up the band of five lights so the display uses 2+3+4+5+6. As the signal increases the band of five display elements moves up until it reaches the nth element. At the point of reaching (n), the display is indicating (n−4), (n−3), (n−2), (n−1), (n).

When the signal exceeds the maximum value for the fifth sub-range, the system could beep to inform the operator of the shift to the sixth sub-range. In the sixth sub-range, the band of six display elements begins with 1+2+3+4+5+6 the display will go up to indicating 2+3+4+5+6+7 and so on until the signal reaches (n) again where the display will indicate (n−5), (n−4), (n−3), (n−2), (n−1), (n).

Again when the signal exceeds the maximum value for the sixth sub-range, the system could optionally beep to inform the operator and shift to rolling in groups of seven display elements at a time. This band of seven display elements can continue to move up the bar just as with the groups of six and five display elements, etc. discussed above. This band of seven display elements might eventually reach the last seven display elements indicated by (n−6), (n−5), (n−4), (n−3), (n−2), (n−1), (n). The next sub-range uses eight display elements at a time, then nine at a time and so on until (n−1) display elements is reached. This process can continue until the display is filled completely. When the display is full and the signal exceeds the nth element, the audio indicator may be activated and the entire bar of display elements can be made to flash. This is the maximum level that can be indicated.

Figure 6:
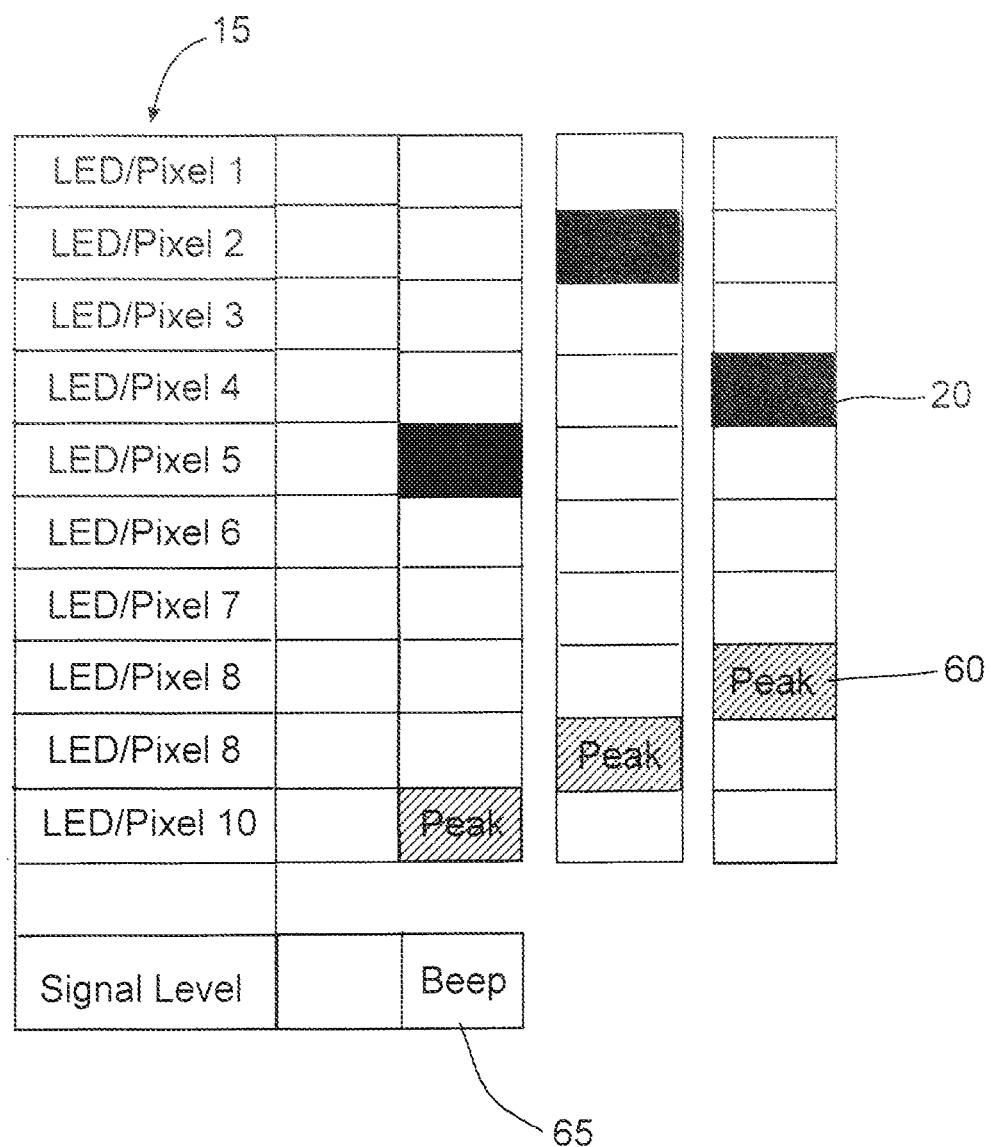
FIG. 6 is a diagram illustrating the rolling display with a peak-hold feature.
Figure 7:
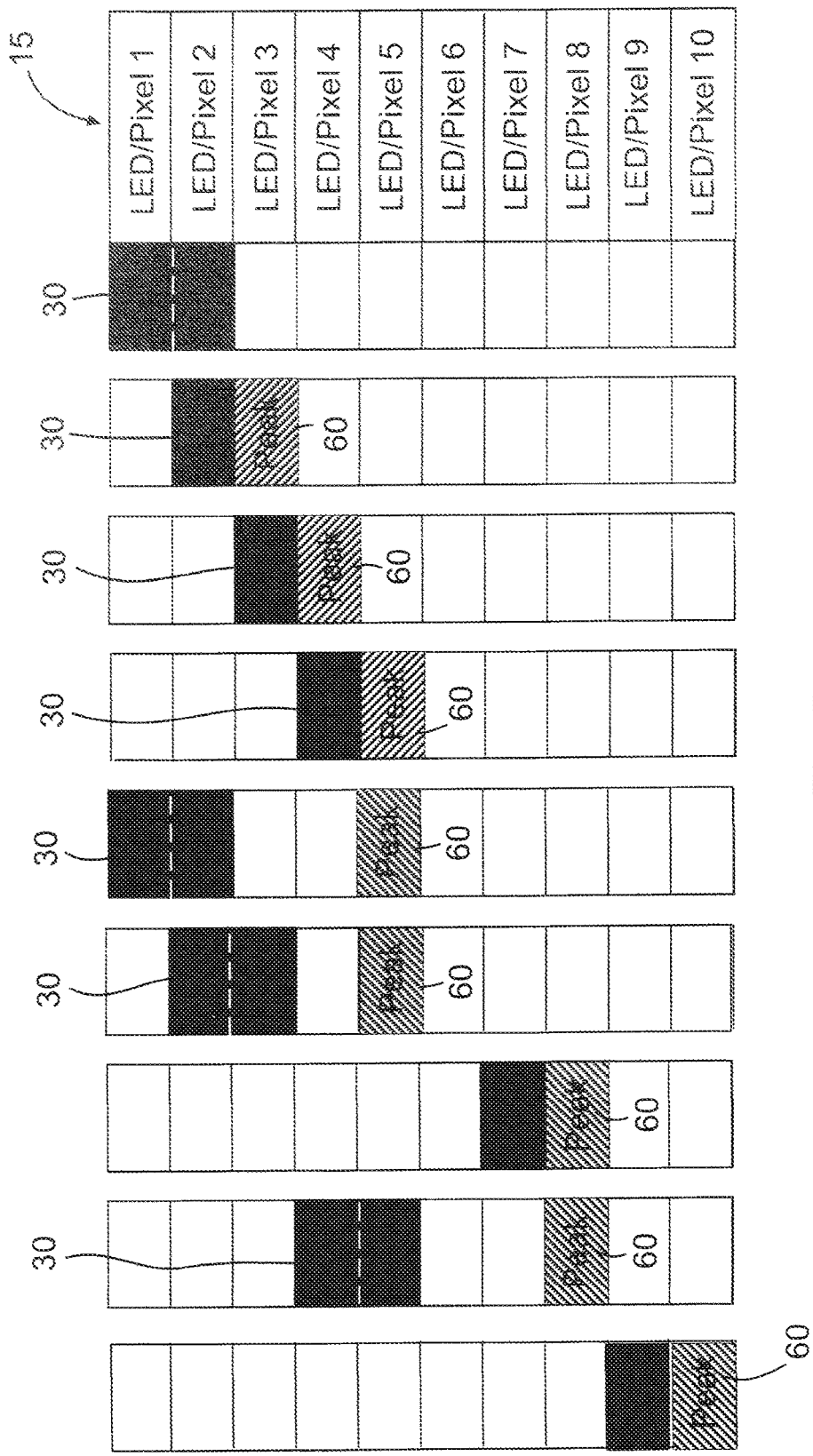
FIG. 7 is a diagram illustrating the rolling display similar to FIG. 3 using two display elements at a time, with the peak-hold feature active.
Figure 8:
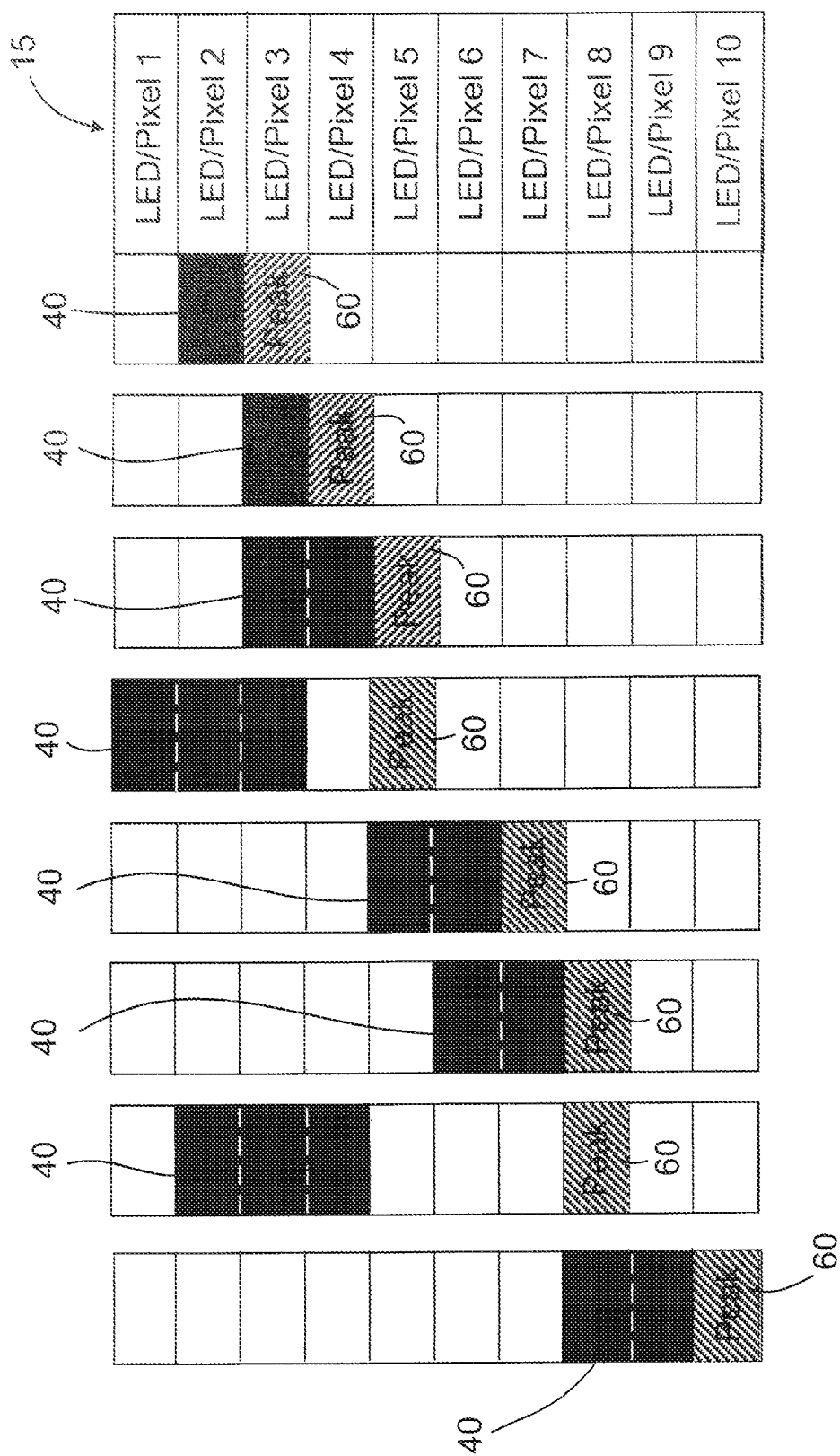
FIG. 8 is a diagram illustrating the rolling display similar to FIG. 4 using three display elements at a time, with the peak-hold feature active.
Figure 13:
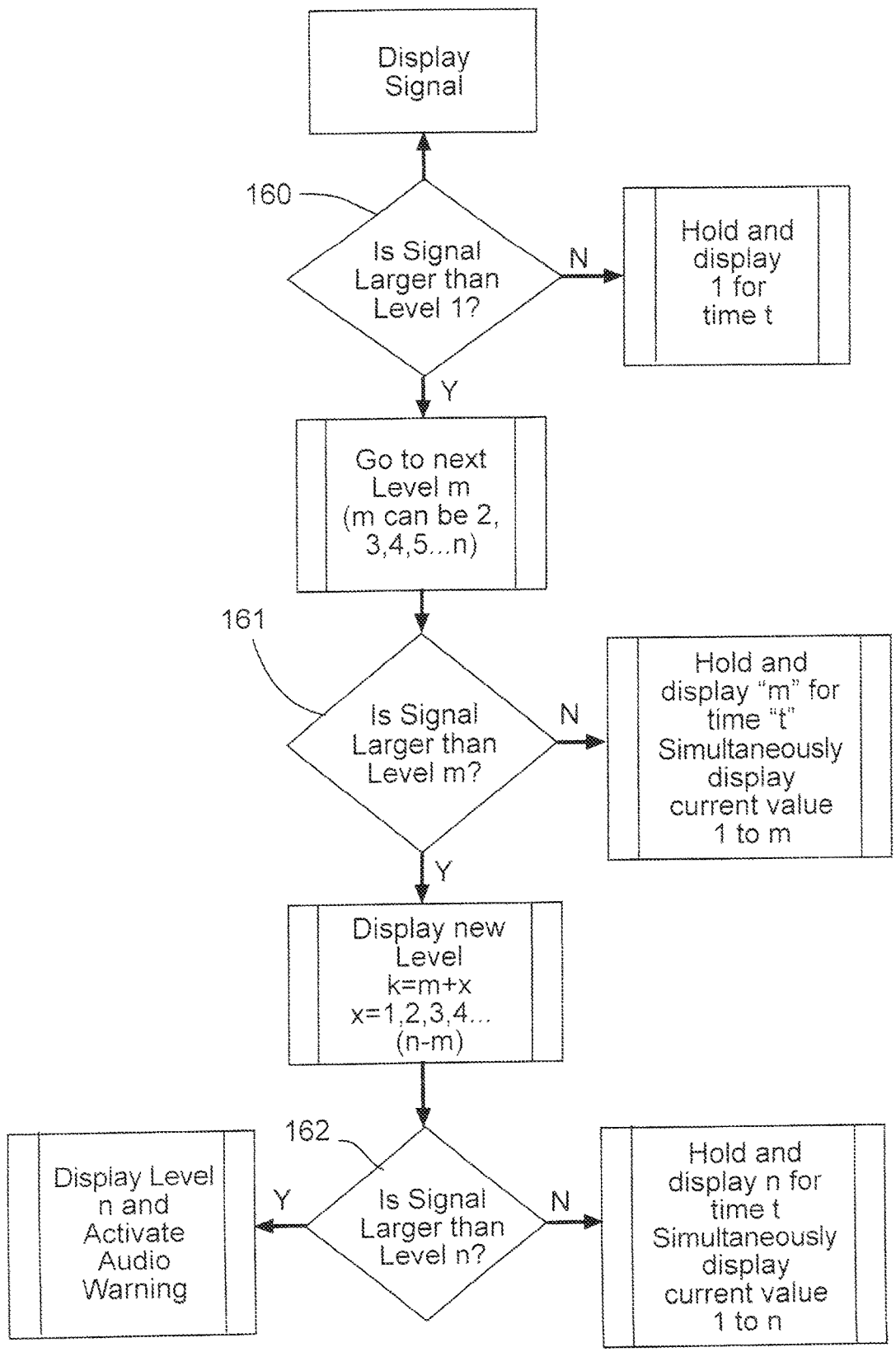
FIG. 13 is a flowchart illustrating the peak-hold mode.

The display may also include a feature indicating the peak or maximum reading 60 encountered. Examples of this peak-hold feature are shown in the displays illustrated in FIGS. 6, 7 and 8. FIG. 13 is an exemplary flowchart of the peak-hold feature. The peak-hold feature assists the user in determining the maximum value found during an inspection without requiring the user to continually look at the display. For example, the peak-hold feature can be implemented in any sub-range using one display element 60 to indicate the highest signal level detected. Preferably, the maximum reading and the current reading are simultaneously displayed, as shown in FIGS. 6-8. An example of a display for this mode in the first sub-range (i.e., using one display element to show the current value and one display element 60 to indicate the maximum value) is shown in FIG. 6. Similarly, FIG. 7 illustrates the second sub-range using two display elements to show the current value, and FIG. 8 illustrates the third sub-range using three display elements to show the current value.

The particular embodiment of the peak-hold feature in FIG. 13 holds and displays the maximum value, m, detected in each sub-range (steps 160-162) for up to a predetermined period of time, t. If a greater value is detected during this period of time, the new maximum value is displayed and the timer is reset. Otherwise, the maximum value is set to the current value at the end of the period of time, t. It should be understood that the peak-hold feature could be implemented using any of a variety of other procedures.

The above disclosure sets forth a number of embodiments of the present invention described in detail with respect to the accompanying drawings. Those skilled in this art will appreciate that various changes, modifications, other structural arrangements, and other embodiments could be practiced under the teachings of the present invention without departing from the scope of this invention as set forth in the following claims.

I claim:

1. A method for displaying sensor readings in a measurement instrument having a sensor with a range of interest and a display with an array of display elements, said method comprising:
   dividing the range of interest of the sensor into a plurality of consecutive sub-ranges;
   determining a scaling function for displaying sensor readings for each sub-range extending over the array of display elements; and
   iteratively receiving a sensor reading and:
   (a) determining the sub-range in which the sensor reading falls, where N is the number of this sub-range; and
   (b) displaying the sensor reading on the display as a set of N display elements, wherein the position of the N display elements within the array indicates the value of the sensor reading within the Nth sub-range based on the scaling function for the Nth sub-range.

2. The method of claim 1 wherein the sensor reading is displayed by N consecutive display elements in the array.

3. The method of claim 1 further comprising activating an indicator when sensor readings roll from one sub-range to another.

4. The method of claim 3 wherein the indicator is audible.

5. The method of claim 3 wherein the indicator comprises an additional display element in the display.

6. The method of claim 1 further comprising tracking the maximum reading in the sub-range over time, and displaying the maximum reading on the display elements.

7. The method of claim 6 wherein the maximum reading and the current reading are simultaneously displayed.

8. The method of claim 6 wherein each maximum reading is displayed for up to a predetermined period of time unless a greater maximum reading is found during said period.

9. A method for displaying sensor readings in a measurement instrument having a sensor with a range of interest and a display with an array of display elements, said method comprising:
   dividing the range of interest of the sensor into a plurality of consecutive sub-ranges;
   determining a scaling function for displaying sensor readings for each sub-range extending over the array of display elements; and
   iteratively receiving a sensor reading and:
   (a) determining the sub-range in which the sensor reading falls, where N is the number of this sub-range; and
   (b) displaying the sensor reading on the display with a set of N consecutive display elements to indicate the Nth sub-range, and wherein the position of the N consecutive display elements within the array indicates the value of the sensor reading within the Nth sub-range based on the scaling function for the Nth sub-range.

10. The method of claim 9 further comprising activating an indicator when sensor readings roll from one sub-range to another.

11. The method of claim 10 wherein the indicator is audible.

12. The method of claim 10 wherein the indicator comprises an additional display element in the display.

13. The method of claim 9 further comprising tracking the maximum reading in the sub-range over time, and displaying the maximum reading on the display elements.

14. The method of claim 13 wherein the maximum reading and the current reading are simultaneously displayed.

15. The method of claim 13 wherein each maximum reading is displayed for up to a predetermined period of time unless a greater maximum reading is found during said period.

* * * * *